United States Patent
Ehrmann et al.

(10) Patent No.: US 10,006,807 B2
(45) Date of Patent: Jun. 26, 2018

(54) APPARATUS FOR DETERMINING AN OPTICAL PROPERTY OF AN OPTICAL IMAGING SYSTEM

(71) Applicant: Carl Zeiss SMT GmbH, Oberkochen (DE)

(72) Inventors: Albrecht Ehrmann, Aalen (DE); Markus Goeppert, Karlsruhe (DE); Helmut Haidner, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 309 days.

(21) Appl. No.: 15/075,369

(22) Filed: Mar. 21, 2016

(65) Prior Publication Data

US 2016/0202118 A1 Jul. 14, 2016

Related U.S. Application Data

(63) Continuation of application No. PCT/EP2014/002528, filed on Sep. 18, 2014.

(30) Foreign Application Priority Data

Sep. 20, 2013 (DE) .................. 10 2013 218 991

(51) Int. Cl.
*G01J 1/44* (2006.01)
*G01J 1/04* (2006.01)
(Continued)

(52) U.S. Cl.
CPC .............. *G01J 1/44* (2013.01); *G01J 1/0407* (2013.01); *G01J 1/4228* (2013.01); *G01J 3/18* (2013.01);
(Continued)

(58) Field of Classification Search
CPC ..... G01J 1/4228; G01J 13/18; G01J 2001/444
See application file for complete search history.

(56) References Cited

U.S. PATENT DOCUMENTS

| 5,892,573 A | 4/1999 | Takahashi et al. |
| 7,709,816 B2 | 5/2010 | Bakshi et al. |

(Continued)

FOREIGN PATENT DOCUMENTS

| DE | 10109929 A1 | 11/2001 |
| DE | 69625093 T2 | 7/2003 |

(Continued)

OTHER PUBLICATIONS

International Search Report in counterpart International Application No. PCT/EP2014/002528, dated Feb. 4, 2015.
(Continued)

*Primary Examiner* — Yara B Green
(74) *Attorney, Agent, or Firm* — Edell, Shapiro & Finnan, LLC

(57) ABSTRACT

An apparatus (10) determining an optical property of an imaging system (12) includes an illumination system (20) directing electromagnetic radiation (18) onto an object plane (22) of the imaging system, a utilization detector (42) determining the optical property, an output coupling device (46), and an intensity sensor (50). The detector captures the radiation after it has traveled along a utilized beam path (45) extending to the utilization detector. The output coupling device couples sensor radiation (48) out of the utilized beam path and into a sensor beam path (49) that differs from the utilized beam path. The intensity sensor records an angularly resolved intensity distribution present at least at one point in the object plane of the optical imaging system, which intensity distribution reproduces the intensity of the electromagnetic radiation in dependence on the angle of incidence with respect to the object plane.

22 Claims, 8 Drawing Sheets

(51) Int. Cl.
*G01J 1/42* (2006.01)
*G01J 3/18* (2006.01)
*G03F 7/20* (2006.01)
*G01M 11/02* (2006.01)

(52) U.S. Cl.
CPC ......... *G01M 11/0271* (2013.01); *G03F 7/706* (2013.01); *G03F 7/7085* (2013.01); *G03F 7/70133* (2013.01); *G03F 7/70591* (2013.01); *G01J 2001/444* (2013.01)

(56) References Cited

U.S. PATENT DOCUMENTS

| | | |
|---|---|---|
| 8,102,511 B2 | 1/2012 | Bakker |
| 2002/0001088 A1 | 1/2002 | Wegmann et al. |
| 2003/0142322 A1 | 7/2003 | Sato |
| 2006/0109533 A1 | 5/2006 | Schriever et al. |
| 2007/0008509 A1 | 1/2007 | Shiraishi |
| 2011/0013171 A1 | 1/2011 | Mueller et al. |
| 2012/0182537 A1 | 7/2012 | Yakunin et al. |
| 2014/0118712 A1 | 5/2014 | Goeppert et al. |

FOREIGN PATENT DOCUMENTS

| | | |
|---|---|---|
| DE | 102005041373 A1 | 6/2006 |
| DE | 102007054683 A1 | 5/2009 |
| DE | 102008002247 A1 | 12/2009 |
| DE | 102011077223 A1 | 12/2012 |
| EP | 1184727 A1 | 3/2002 |

OTHER PUBLICATIONS

Office Action in corresponding German Application No. 102013218991.5, dated Nov. 11, 2015, along with an English translation.

International Preliminary Report on Patentability in counterpart International Application No. PCT/EP2014/002528, dated Mar. 22, 2016.

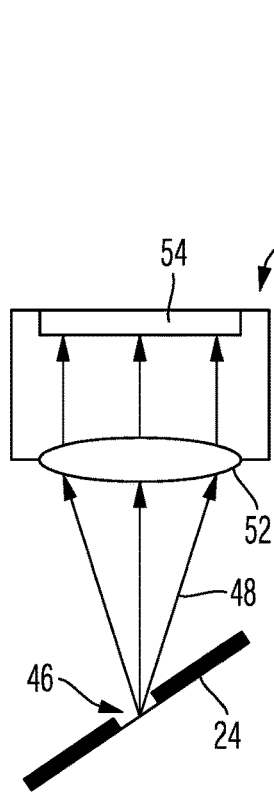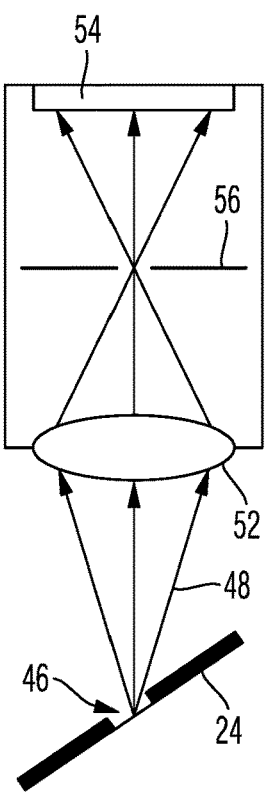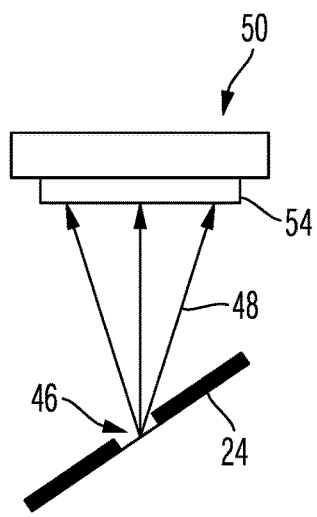
Fig. 5A    Fig. 5B    Fig. 5C
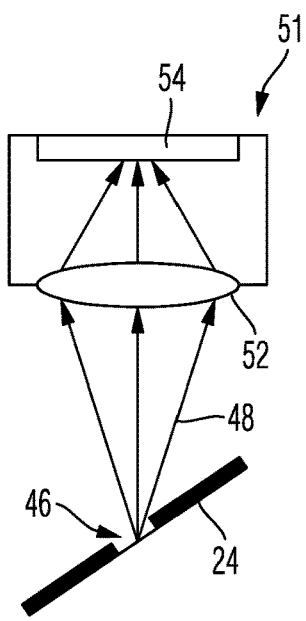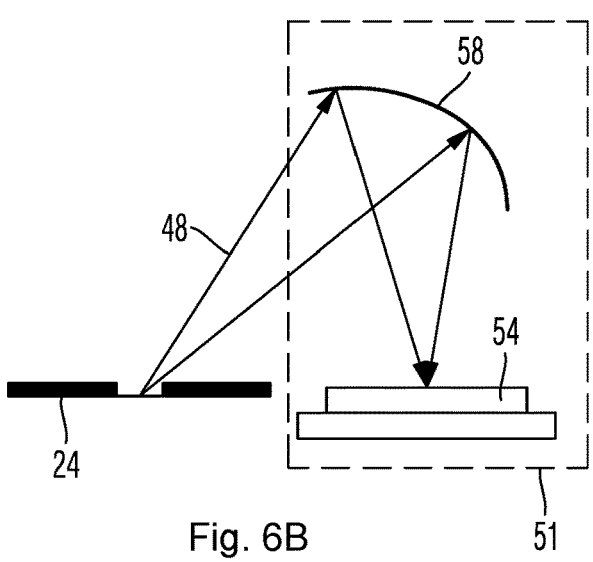
Fig. 6A    Fig. 6B Fig. 11
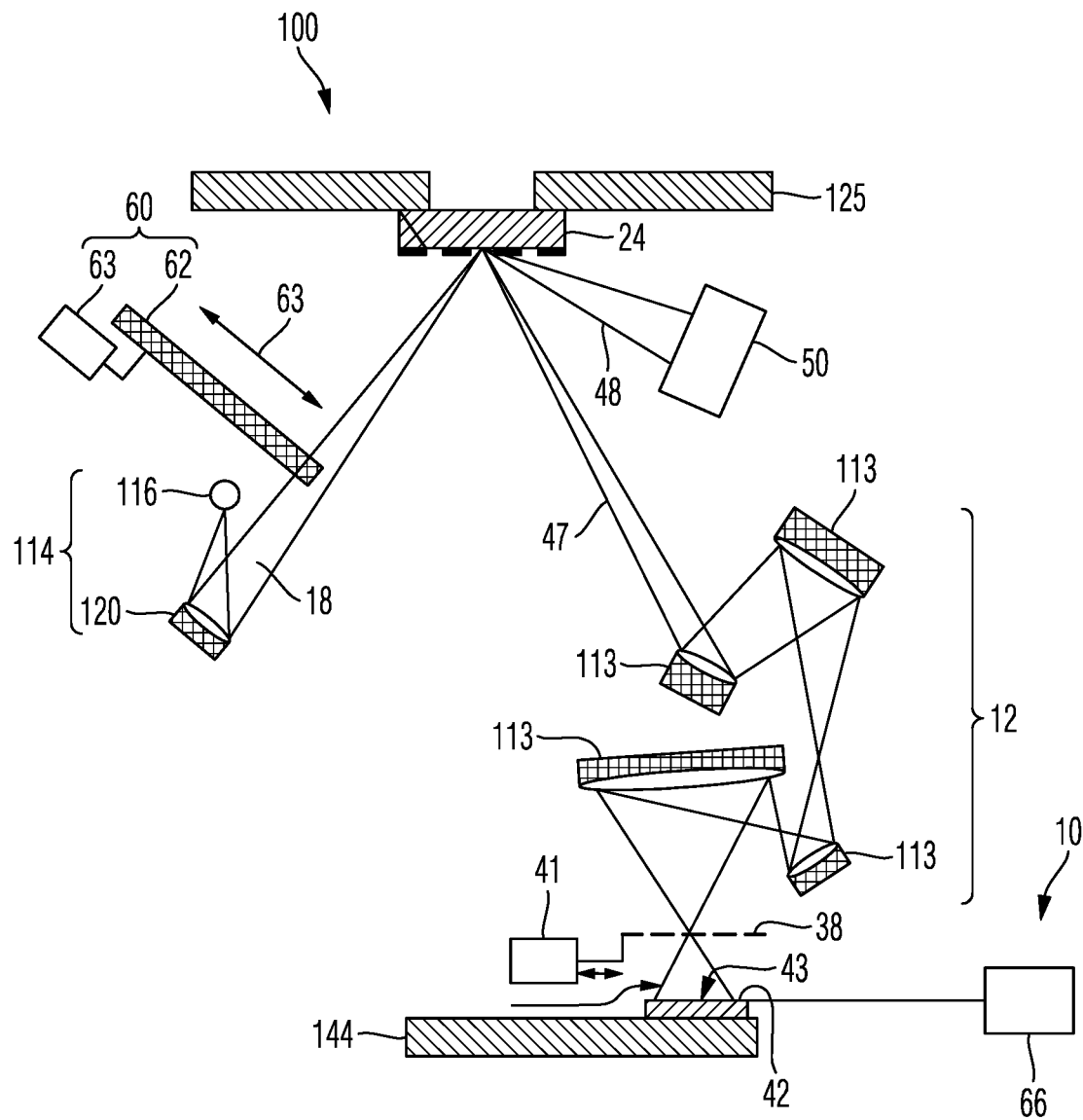
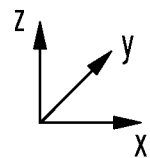

APPARATUS FOR DETERMINING AN OPTICAL PROPERTY OF AN OPTICAL IMAGING SYSTEM

CROSS REFERENCE TO RELATED APPLICATIONS

This is a Continuation of International Application PCT/EP2014/002528, which has an international filing date of Sep. 18, 2014, and the disclosure of which is incorporated in its entirety into the present Continuation by reference. The following disclosure is also based on and claims the benefit of and priority under 35 U.S.C. § 119(a) to German Patent Application No. DE 10 2013 218 991.5, filed Sep. 20, 2013, which is also incorporated in its entirety into the present Continuation by reference.

FIELD OF THE INVENTION

The invention relates to an apparatus and to a method for determining a property of an optical imaging system and to a microlithographic projection exposure apparatus having such an apparatus.

BACKGROUND

One important area of application for the invention is for wavefront measurements of high-resolution projection lenses in microlithography for semiconductor wafer patterning so as to be able to determine aberrations of the projection lens with high precision. As is known to the person skilled in the art, it is possible for this purpose to use, for example, a technique based on lateral shearing interferometry or other interferometry techniques such as point diffraction interferometry (PDI) or line diffraction interferometry (LDI). Also possible is the use of a Shack-Hartmann sensor or a sensor based on moiré techniques.

In one embodiment of shearing interferometry, a so-called coherence mask is placed in the object plane of the optical system to be examined. An object pattern is arranged thereon. A reference pattern designed as a diffraction grating is located in the image plane of the imaging system. Due to the superposition of the waves produced by diffraction at the diffraction grating, a superposition pattern in the form of an interferogram is produced, which is captured using a suitable detector. Possible embodiments of a coherence mask and of a diffraction grating of a shearing interferometer are specified, for example, in DE 10 2005 041 373 A1.

However, reproducibility and absolute accuracy of the wavefront measurements carried out using conventional shearing interferometry methods are often insufficient, in particular in the case of optical systems designed for EUV radiation.

Another area of application of the invention is for determining pupil-resolved transmission behavior of high-resolution projection lenses in microlithography, also referred to as "apodization." Here, a spatially resolving detector, which is arranged below the image plane of the projection lens, is used to record an intensity distribution. The accuracy of the measurements carried out using conventional methods is here often also insufficient.

SUMMARY

It is an object of the invention to provide an apparatus and a method with which the above-mentioned problems can be addressed, and in particular an optical property of an optical system, such as wavefront aberration behavior or pupil-resolved transmission behavior, can be determined with improved accuracy.

The object according to the invention can be achieved using an apparatus configured to determine an optical property of an optical imaging system, in particular a lens of a microlithographic projection exposure apparatus, which is configured as follows. The apparatus according to the invention comprises an illumination system configured to direct electromagnetic radiation generated by a radiation source onto an object plane of the imaging system, in particular to focus it onto the object plane, and a utilization detector configured to determine the optical property. The utilization detector is configured to capture the electromagnetic radiation after it has traveled along a utilized beam path. The utilized beam path here extends from the radiation source via the imaging system to the utilization detector. The apparatus according to the invention furthermore comprises an output coupling device, which is arranged in the utilized beam path and configured to couple sensor radiation out of the utilized beam path with the result that the coupled-out sensor radiation extends along a sensor beam path that differs from the utilized beam path. The apparatus according to the invention furthermore comprises an intensity sensor arranged in the sensor beam path to record an angularly resolved intensity distribution at least at one point in the object plane of the optical imaging system, which intensity distribution reproduces the intensity of the electromagnetic radiation in dependence on the angle of incidence with respect to the object plane.

The sensor radiation can be coupled out of the utilized beam path on the basis of the output coupling device according to the invention, as a result of which the incidence-angle-resolved intensity distribution is determined with a high resolution over the entire angle range, i.e. the entire pupil. This can be done for different points in the object plane, wherein any desired field points captured by the utilized beam path are here measured with respect to the incidence-angle-resolved intensity distribution. In other words, there are no restrictions with respect to the measurable angular range nor with respect to the measurable field region.

When the apparatus is used for determining the wavefront aberration behavior of the optical imaging system using interferometric methods, such as shearing interferometry, it is possible to computationally correct recorded interferograms with high accuracy on the basis of the angularly resolved intensity distributions ascertained by the intensity sensor according to the invention. This correction enables the determination of the wavefront aberration behavior of the optical imaging system with improved accuracy and reproducibility.

When the apparatus is used for determining the pupil-resolved transmission behavior of the optical imaging system, the angularly resolved intensity distributions ascertained by the intensity sensor according to the invention make it possible to subtract with high accuracy the influence of the illumination system out of the measurements carried out by the utilization detector. While generally the angularly resolved intensity distribution in the object plane is presumed to be known in conventional apodization measurements, the apparatus according to the invention makes it possible to take into account the actual intensity distribution in the apodization measurement. This can be done in particular by subtracting the intensity distribution measured by the intensity sensor from the intensity distribution measured by the utilization detector.

According to one embodiment, the intensity sensor is arranged in the sensor beam path such that the incidence-angle-dependent intensity distribution present in the object plane of the optical imaging system can be recorded directly thereby, which is the case for example if the intensity sensor is arranged in the region of a pupil plane of the illumination system or in a plane which is conjugate thereto. If the intensity sensor is not arranged in a plane that is suitable for directly recording the incidence-angle-dependent intensity distribution, the intensity sensor can be equipped with a computation unit for calculating back from measured intensity values to the incidence-angle-dependent intensity distribution in the object plane using ray tracing.

The apparatus preferably furthermore comprises an evaluation device configured to ascertain the optical property from a signal that is recorded by the utilization detector in capturing the electromagnetic radiation, taking into consideration the incidence-angle-dependent intensity distribution recorded by the intensity sensor. The signal recorded by the utilization detector can here be corrected in particular in a time-resolved manner.

According to a further embodiment of the apparatus according to the invention, the output coupling device is arranged within in a region of the utilized beam path that is located upstream of the imaging system. In other words, the output coupling device is arranged at a location of the utilized beam path that is located upstream of the optical imaging system with respect to the radiation traveling along the utilized beam path.

According to a further embodiment according to the invention, the output coupling device is arranged in the illumination system. The output coupling device can be configured here, for example, as a diffusing plate, spectral filter or beam splitter.

According to a further embodiment according to the invention, the output coupling device has an at least partially reflective element. The at least partially reflective element serves to couple the sensor radiation out of the utilized beam path by way of reflection and can be formed, for example, by a partially reflective layer on a mask membrane, such as for example a partially transmissive EUV MoSi layer system. The at least partially reflective element can in particular have a grating which lets the utilized radiation through by reflection in zeroth order of diffraction and couples the sensor radiation out by reflection in an order of the diffraction that differs from the zeroth order of diffraction.

According to a further embodiment according to the invention, the apparatus furthermore has a test mask arranged in the object plane and the output coupling device is part of the test mask.

According to a further embodiment according to the invention, the illumination system is configured to irradiate the object plane obliquely with the electromagnetic radiation. This is understood to mean an incidence direction that deviates from the normal on the object plane, in particular by more than 3° or even by more than 10°.

According to a further embodiment according to the invention, the output coupling device comprises a radiation-converting element configured to generate the sensor radiation from part of the electromagnetic radiation traveling along the utilized beam path by way of changing the wavelength. Such a radiation-converting element can be designed as a fluorescent element or as a scintillator. A fluorescent element can be formed, for example, by a fluorescent layer arranged on a mask membrane that is non-transmissive for fluorescent light. The fluorescent element can be formed, for example, from P43, i.e. gadolinium oxysulfide that is doped with terbium ($Gd_2O_2S:Tb$) or carrier materials, such as YAG, YAP or quartz, that are doped with cerium. In the case of a test mask operated in reflection, a scintillator layer can furthermore be arranged as an intermediate layer between a capping layer reflecting EUV radiation and a mask carrier. What can be achieved hereby is that the radiation-converted sensor radiation, which passes through the mask carrier that is non-transmissive for EUV radiation, can be recorded using the intensity sensor arranged downstream of the test mask.

According to a further embodiment according to the invention, the output coupling device is configured to couple radiation having a wavelength that differs from an operating wavelength of the optical imaging system out of the electromagnetic radiation of the utilized beam path as sensor radiation. In other words, the sensor radiation that has been coupled out has a wavelength that differs from the operating wavelength of the optical imaging system, and the wavelength of the sensor radiation is in particular at least twice as large as the operating wavelength of the optical imaging system. By way of example, the operating wavelength of the optical imaging system lies within the EUV wavelength range, and the sensor radiation lies in a wavelength range that extends from the UV range via the visible range up to the infrared range. By way of example, the sensor radiation is at least partially reflected at a mask membrane that is non-transmissive for the wavelength of the sensor radiation, while the radiation having the operating wavelength passes through the mask membrane.

According to a further embodiment according to the invention, the output coupling device is configured to couple the sensor radiation out of the utilized beam path by way of +/−4th order of diffraction or an order of diffraction which is higher in terms of absolute value. To this end, it is possible, for example, to use as sensor radiation light that is formed at the test mask in +4th, in −4th order of diffraction and or an order of diffraction which is higher in terms of absolute value, i.e. in +5th, in −5th, in +6th, in −6th and/or in +7th, in −7th etc. These orders of diffraction have a greater numerical aperture than the optical imaging system and therefore do not reach the utilization detector, since they are generally blocked by the optical imaging system. The intensity sensor for capturing said diffraction light can be arranged either in the region between the test mask and the optical imaging system, or at a mount of an optical element in the imaging system. Alternatively, the output coupling device can also comprise a diffusing plate that is specifically arranged in the utilized beam path.

According to a further embodiment according to the invention, the output coupling device comprises a diffraction grating. Such a diffraction grating can be configured to let the utilized radiation in zeroth order of diffraction pass along the utilized beam path and to couple the sensor radiation in an order of diffraction that differs from the zeroth order of diffraction out. Such a diffraction grating can be arranged, for example, on a spectral filter in the illumination system or on a test mask. A diffraction grating can be implemented, for example, on a spectral filter operated in transmission with small openings. The diffraction grating can be configured as a partially transparent membrane grating that is formed from multi-ply layers and for which the reflectance can be adjusted by the number of plies.

According to a further embodiment according to the invention, the output coupling device comprises an analysis grating configured to generate an interferogram on the utilization detector from a radiation component of the electromagnetic radiation having a first wavelength and to direct a radiation component of the electromagnetic radiation having a second wavelength in an order of diffraction other than the zeroth order of diffraction onto the intensity sensor. What is understood to mean by an order of diffraction other than the zeroth order of diffraction is the +/−1st or +/−2nd order of diffraction or an order of diffraction which is higher in terms of absolute value. The interferogram formed from the radiation having the first wavelength is spatially separated from the radiation having the second wavelength in the order diffraction that differs from the zeroth order of diffraction. In particular, the output coupling device is arranged in the region of the utilized beam path that is located downstream in the imaging system. The electromagnetic radiation generated by the radiation source comprises the radiation components having the first and the second wavelength, wherein the first wavelength corresponds to the operation wavelength of the optical imaging system and can be, for example, an EUV wavelength, and the second wavelength can be, for example, in the UV range, in the visible range or in the infrared range.

According to a further embodiment according to the invention, the utilization detector and the intensity sensor are integrated in a unipartite detector. The utilization detector has various capturing regions, one for capturing the electromagnetic radiation after it has traveled along the utilized beam path and one for capturing the sensor radiation.

According to a further embodiment according to the invention, the apparatus is configured to periodically interrupt the radiation emitted by the illumination system such that the radiation is incident on the object plane in packets of radiation that are limited in duration. The radiation packets have a minimum time length of 50 ms and in particular a maximum length of 5 seconds. The periodic interruption can take place by moving a closure element into and out of the beam path of the electromagnetic radiation. Alternatively, the periodic interruption can take place by triggering a radiation source generating the electromagnetic radiation. Each of the radiation packets is used to generate an interferogram on the detector, the respective radiation energy of the individual radiation packets is measured in angularly resolved fashion using the intensity sensor, the interferogram generated by the corresponding radiation packet is associated with the respective measured angularly resolved radiation energy distribution, the interferograms are manipulated using the radiation energy distributions that are associated with the individual interferograms, and from the manipulated interferograms the wavefront of the electromagnetic radiation is ascertained after the interaction thereof with the optical system.

According to a further embodiment according to the invention, the apparatus is designed for an operating wavelength in the EUV wavelength range. In other words, the utilized radiation traveling along the utilized beam path is EUV radiation.

According to a further embodiment according to the invention, the apparatus furthermore has an evaluation device configured to carry out a correction of the optical property of the optical imaging system, which is determined by the utilization detector, on the basis of the angularly resolved intensity distribution that is recorded by the intensity sensor. In other words, the evaluation device is configured to correct the measurement carried out by the utilization detector on the basis of the angularly resolved intensity distribution that is recorded by the intensity sensor and to generate therewith with high accuracy a measurement result of the optical property.

According to a further embodiment according to the invention, the optical property which is determinable with the apparatus comprises a wavefront aberration behavior of the optical imaging system. To this end, the apparatus comprises a wavefront measurement device, in particular a shearing interferometer. The optical property which is correctable using the evaluation device in particular comprises a wavefront aberration behavior of the optical imaging system.

According to a further embodiment according to the invention, the optical property to be determined with the apparatus comprises a pupil-resolved transmission behavior of the optical imaging system. As already explained above, a pupil-resolved transmission behavior is also referred to as "apodization" in the art. What should be noted here however is that the term "apodization" in this case does not refer to the method of optical filtering, which is specified in this regard in many textbooks and in which the outer rings of an Airy disk are suppressed to improve the contrast of the image at the expense of the resolution. Rather, the term "apodization" in this application is understood to mean a pupil-resolved transmission behavior of the optical imaging system, in particular the ratio between the transmission behavior of a ray running centrally through the pupil (central ray) and the transmission behavior of a ray running through the edge of the pupil (marginal ray).

In particular, the apparatus furthermore has an evaluation device configured to determine a pupil-resolved transmission behavior of the optical imaging system by evaluating measurement results of the utilization detector and the angularly resolved intensity distribution recorded by the intensity sensor. In other words, the optical property of the optical system that is to be determined is the pupil-resolved transmission behavior, and the angularly resolved intensity distribution provided by the intensity sensor makes it possible to subtract out the influence of the illumination system on the measurement result of the utilization detector with high accuracy. On account of the explicit measurement of the angularly resolved intensity distribution in the object plane, the pupil-resolved intensity distribution can be determined with a higher accuracy than would be possible merely on the basis of the measurement of the utilization detector, for example taking into consideration an estimate of the intensity distribution on the object plane.

According to a further embodiment, the evaluation device is configured to carry out a correction of the optical property, in particular of the wavefront aberration behavior, of the optical imaging system, which is determined by the utilization detector, on the basis of the angularly resolved intensity distribution that is recorded by the intensity sensor, and is also configured to determine a pupil-resolved transmission behavior of the optical imaging system by evaluating measurement results of the utilization detector and the angularly resolved intensity distribution recorded by the intensity sensor.

According to an embodiment, relative movements of the radiation source with respect to the membrane of a test mask are measured using a detection system and taken into consideration when evaluating the apodization measurement.

According to a further embodiment, the intensity sensor comprises a focusing element and a two-dimensional resolving intensity detector, also referred to as a camera, downstream of the focusing element. Alternatively, the intensity sensor can also be designed without a focusing element.

According to an embodiment variant, a stop is arranged in a focus plane between the focusing element and the intensity detector. The stop simulates a filtering of the angular distribution of the radiation source occurring due to the membrane of a test mask. Alternatively, the filtering due to the membrane can also take place by way of calculation.

According to a further embodiment according to the invention, the intensity sensor is furthermore configured to record the intensity distribution in the object plane of the optical imaging system in spatially resolved fashion. In other words, in addition to the incidence-angle-dependent intensity distribution, the spot form of the radiation source is recorded at least at one location of the object plane. To this end, the intensity sensor can have 2 separate measurement modules, one for determining the incidence-angle-dependent intensity distribution and one for determining the spatially resolved intensity distribution. Alternatively, the intensity sensor can also be configured to combine both measurement functions in one measuring instrument, wherein the measuring instrument can switch between the measurement functions, such as for example by changing a distance between a focusing element and a camera.

According to the invention, a microlithographic projection exposure apparatus is furthermore provided, which has an apparatus integrated therein for determining an optical property in one of the above-mentioned embodiments.

According to the invention, a method for determining an optical property of an optical imaging system is furthermore provided, which comprises directing, in particular focusing, electromagnetic radiation onto an object plane of the imaging system and determining the optical property with a utilization detector from the electromagnetic radiation after it has traveled along a utilized beam path. Here, the utilized beam path extends from a radiation source for the radiation via the imaging system to the utilization detector. According to the method according to the invention, sensor radiation is furthermore coupled out of the utilized beam path with the result that the coupled-out sensor radiation extends along a sensor beam path that differs from the utilized beam path, and an angularly resolved intensity distribution present at least at one point in the object plane of the optical imaging system is recorded with an intensity sensor arranged in the sensor beam path, which intensity distribution reproduces the intensity of the electromagnetic radiation in dependence on the angle of incidence with respect to the object plane.

According to an embodiment, a correction of a measurement is carried out by the utilization detector when determining the optical property, wherein the correction is performed on the basis of the angularly resolved intensity distribution recorded by the intensity sensor. In particular, the measurement performed by the utilization detector comprises a wavefront aberration behavior of the optical imaging system.

According to a further embodiment, a pupil-resolved transmission behavior of the optical imaging system is determined as the optical property by evaluating a measurement result of the utilization detector and the angularly resolved intensity distribution recorded by the intensity sensor.

The features specified in respect of the embodiments, exemplary embodiments and embodiment variants etc. of the apparatus according to the invention, summarized above, can be accordingly transferred to the method according to the invention. These and other features of the embodiments according to the invention are explained in the description of the figures and in the claims. The individual features can be implemented, either separately or in combination, as embodiments of the invention. Furthermore, they can describe advantageous embodiments which are indepen-dently protectable and protection for which is claimed if appropriate only during or after pendency of the application.

BRIEF DESCRIPTION OF THE DRAWINGS

The above and further advantageous features of the invention are illustrated in the following detailed description of exemplary embodiments according to the invention with reference to the accompanying schematic drawings. In detail:

FIG. 5A shows a sectional view of the intensity sensor in a first embodiment, FIG. 5B shows a sectional view of the intensity sensor in a second embodiment, FIG. 5C shows a sectional view of the intensity sensor in a third embodiment, FIG. 6A shows a sectional view of the further intensity sensor in a first embodiment, FIG. 6B shows a sectional view of the further intensity sensor in a second embodiment, FIG. 11 shows a schematic sectional view of an exemplary embodiment of a microlithographic projection exposure apparatus according to the invention having a projection optics and an apparatus according to the invention, integrated therein, for determining an optical property of the projection optics.

DETAILED DESCRIPTION

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the invention.

Figure 1:
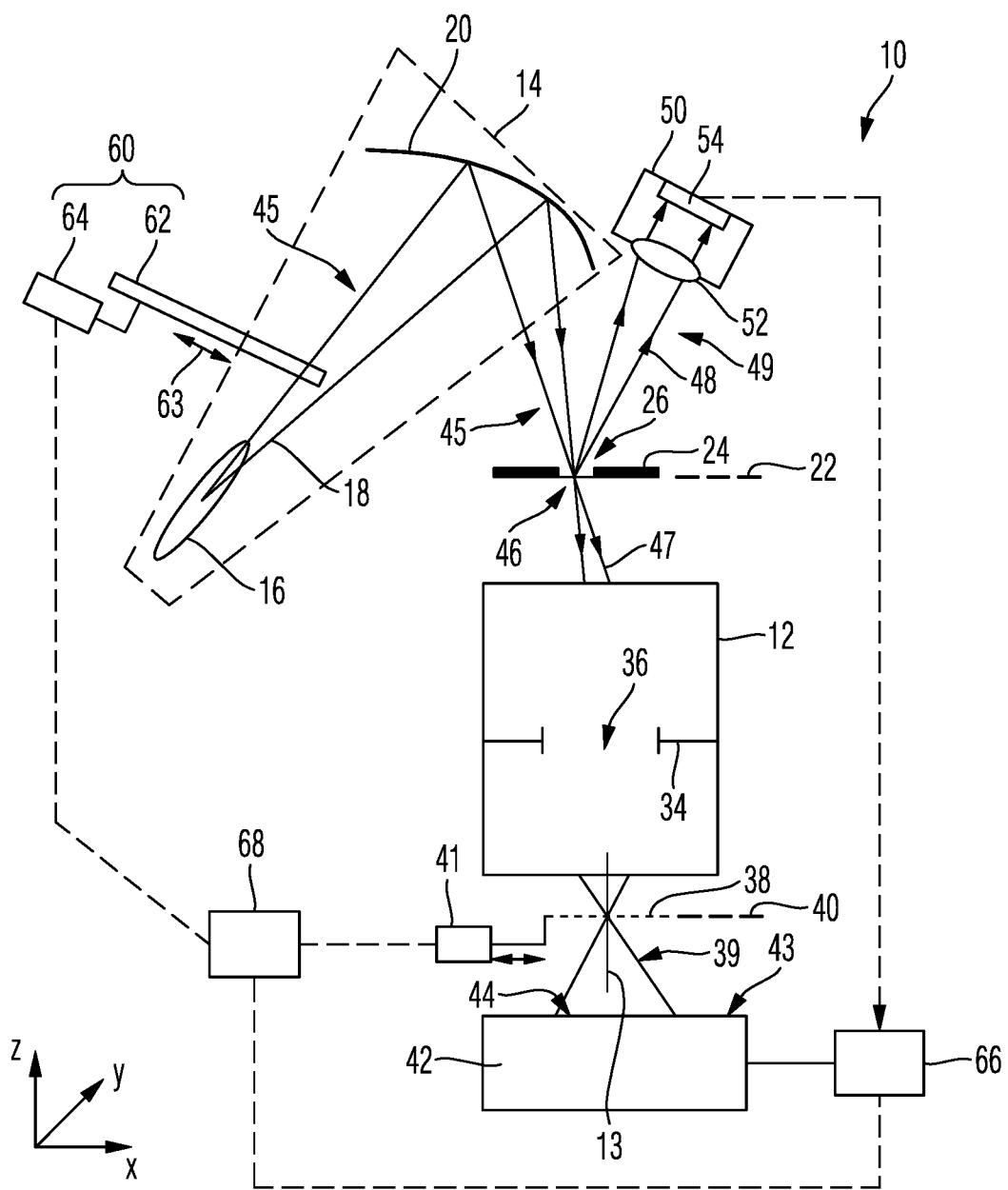
FIG. 1 shows a schematic sectional view of a first exemplary embodiment of an apparatus according to the invention for determining an optical property of an optical system with a test mask and an intensity sensor.

In order to facilitate the description, a Cartesian xyz-coordinate system is indicated in the drawing, from which system the respective positional relationship of the components illustrated in the figures is evident. In FIG. 1, the y-direction runs perpendicular and into the drawing plane, the x-direction toward the right, and the z-direction upwardly.

FIG. 1 shows a first embodiment of an apparatus 10 according to the invention for determining an optical property of an optical imaging system 12 in the form of projection optics of a microlithographic projection exposure apparatus. In the present exemplary embodiment, the optical system to be measured is designed for EUV radiation, i.e. extreme ultraviolet radiation having a wavelength of less than 100 nm, e.g. 13.5 nm or 6.8 nm. The optical imaging system 12 to this end comprises merely reflective optical elements in the form of mirrors. In addition to the optical axis 13 of the optical imaging system 12, FIG. 1 also illustrates an aperture stop 34, which defines a pupil 36 of the optical imaging system 12. The optical property to be determined with the apparatus 10 according to the invention can be in particular a wavefront aberration behavior of the optical imaging system 12 or a pupil-resolved transmission behavior of the optical imaging system.

As already explained in the general part of the description, the pupil-resolved transmission behavior is also referred to as "apodization" in the art. What should be noted here, however, is that the term "apodization" in this case does not refer to the method of optical filtering, which is specified in this regard in many textbooks and in which the outer rings of an Airy disk are suppressed to improve the contrast of the image at the expense of the resolution. Rather, the term "apodization," as mentioned above, in this application is understood to mean a pupil-resolved transmission behavior of the optical imaging system, in particular the ratio between the transmission behavior of a ray running centrally through the pupil 36 (central ray) and the transmission behavior of a ray running through the edge of the pupil 36 (marginal ray).

The configuration of the apparatus 10, illustrated in FIG. 1 and described in more detail below, is specifically configured to determine the wavefront aberration behavior of the optical imaging system 12 from radiation traveling along a utilized beam path 45. Determination of the pupil-resolved transmission behavior requires only small changes to the apparatus illustrated in FIG. 1, which will be explained after the description regarding the measurement of the wavefront aberration behavior.

The apparatus 10 comprises an irradiation arrangement having a radiation source 16 and an illumination system 20. According to the illustrated embodiment, the radiation source 16 comprises a plasma source designed for generating electromagnetic radiation 18 in the form of EUV radiation. The electromagnetic radiation 18 is generated by the radiation source 16 in pulsed form with a repetition rate of approximately 1 pulse per millisecond. The respective pulse duration is here a few nanoseconds.

The apparatus 10 furthermore comprises a beam interruption device 60 in the form of an optical closure or what is known as a "shutter." In the embodiment illustrated in FIG. 1, the beam interruption device 60 is arranged between the radiation source 16 and the illumination system 20, which in the exemplary embodiment illustrated is provided as a mirror. In different exemplary embodiments, the illumination system 20 can also comprise more complex optical arrangements. Alternatively, the beam interruption device 60 can also be arranged at different locations along the beam path of the electromagnetic radiation 18. The beam interruption device 60 comprises a closure element 62 and a displacement device 64, with which the closure element 62 can be moved back and forth along a displacement direction 63. The closure element 62 is here moved into and out of the beam path of the electromagnetic radiation 18. As a result, the electromagnetic radiation 18 can be interrupted after it has traveled along the utilized beam path 45 with the result that the electromagnetic radiation 18 is incident on a utilization detector 42 of the apparatus 10 in packets of radiation that are limited in time. The utilized beam path 45 extends from the radiation source 16 through the illumination system 20 and the optical imaging system 12 up to the utilization detector 42.

During the operation of the apparatus 10, the beam interruption device 60 is actuated such that the resulting packets of radiation have a maximum time length of four seconds, in particular a time length of 100 to 500 ms. The electromagnetic radiation 18 is directed using the illumination system 20 onto a test mask 24, arranged in an object plane 22 of the optical imaging system 12, in the form of a coherence mask of a shearing interferometer. In the case illustrated in FIG. 1, the electromagnetic radiation is focused onto the test mask 24. The direction of incidence of the electromagnetic radiation 18 is here oblique with respect to the test mask 24, i.e. the direction of incidence deviates from the normal with respect to the test mask 24. According to various embodiment variants, the deviation is at least 3° or even at least 10°. The shearing interferometer comprises the test mask 24, an analysis grating 38 and the utilization detector 42.

The test mask 24 has a test structure region 26, in which test structures are arranged, for example in the form of two-dimensional chessboard patterns. In the embodiment illustrated in FIG. 1, the test mask 24 is in the form of a transmission mask. Alternatively, the test mask 24 can also be in the form of a reflective mask, wherein in this case the configuration of the apparatus 10, in particular the configuration of the irradiation arrangement 14, must be adapted accordingly.

Figure 2:
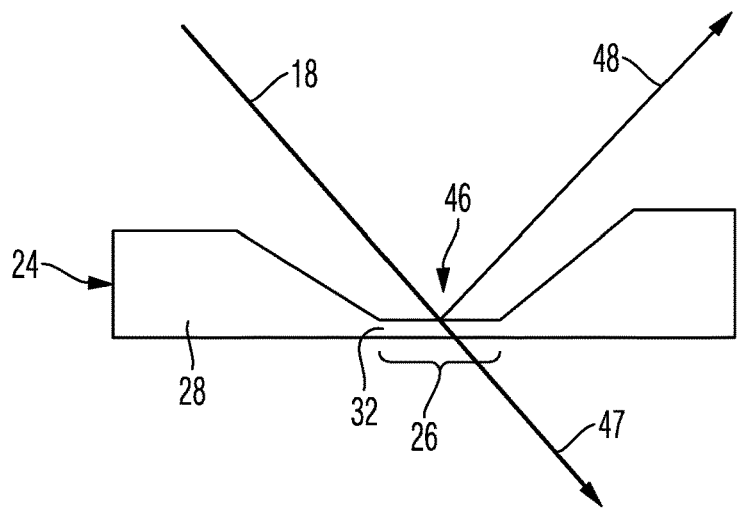
FIG. 2 shows a sectional view of the test mask in a first embodiment.
Figure 3:
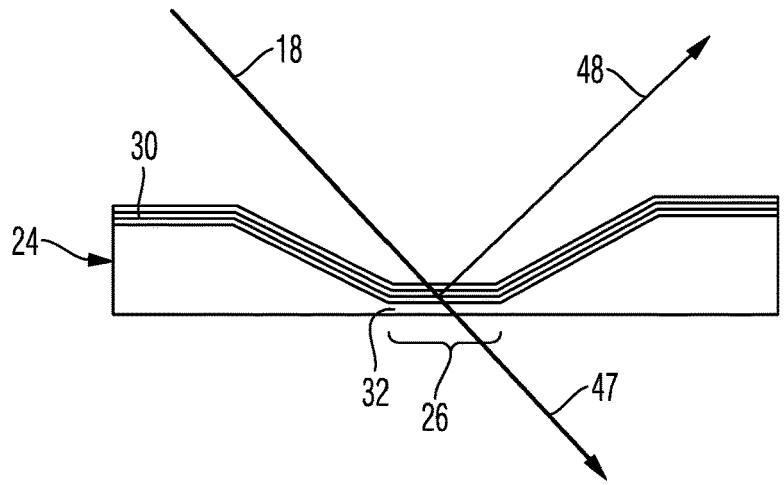
FIG. 3 shows a sectional view of the test mask in a second embodiment.
Figure 4:
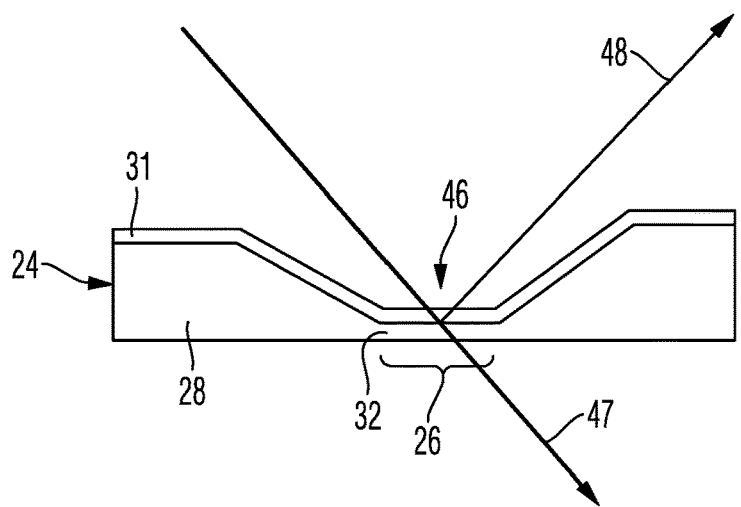
FIG. 4 shows a sectional view of the test mask in a third embodiment.

The test mask 24 has an output coupling device 46 in the test structure region for diverting sensor radiation 48 out of the electromagnetic radiation 18 that is incident on the test masks 24. Coupling out using the output coupling device 46 in the illustrated embodiment is carried out such that the sensor radiation 48 is emitted again by the test mask 24 at the angle of reflection with respect to the direction of incidence of the incident radiation 18. FIGS. 2 to 4 show the various embodiment variants of the test mask 24, in which said coupling-out function is implemented.

According to the embodiment variant illustrated in FIG. 2, the test mask 24 comprises a mask substrate 28, which is thinned in the region of the test structure region 26 into a membrane 32. The above-mentioned test structures are introduced into the membrane 32. The membrane 32 is configured such that it is transmissive for a first spectral range of the incoming electromagnetic radiation 18, e.g. EUV radiation, while it has a partially reflective effect on a second spectral range of the incoming electromagnetic radiation 18. The radiation in the second spectral range can be e.g. light having a wavelength of more than 100 nm, in particular visible light. The membrane 32 according to FIG. 2 in this case forms the output coupling device 46 by reflecting the radiation of the second spectral range as the sensor radiation 48 out of the radiation 18. The portion of the radiation 18 of the first spectral range largely passes through the membrane 32 and continues along the utilized beam path 45 as utilized radiation 47. When using the test mask according to FIG. 2, care should be taken during the configuration of the illumination system 20 that it has a sufficiently high transmittance for the component of the radiation of the second spectral range.

The embodiment variant of the test mask 24 illustrated in FIG. 3 differs from the test mask 24 according to FIG. 2 only in that it is provided on its upper side facing the incoming radiation 18 with a partially reflective layer arrangement 30, which partially reflects radiation of the previously mentioned first spectral range, in particular EUV radiation. The partially reflective layer arrangement 30 in this case forms the output coupling device 46 and can comprise, for example, a MoSi layer system. In this case, the wavelength of the reflected sensor radiation 48 lies substantially in the same range as the wavelength of the utilized radiation 47 which passes through.

The embodiment variant of the test mask 24 illustrated in FIG. 4 differs from the test mask 24 according to FIG. 3 only in that it comprises a radiation-converting layout 31 in the form of a fluorescent layer, rather than the partially reflective layer arrangement 30. The radiation-converting layer 31 is configured to convert the wavelength of a portion of the incoming radiation 18 of the first spectral range, for which the membrane 32 is substantially transmissive, into a wavelength at which the radiation is reflected at the membrane 32. This wavelength, also referred to as fluorescence wavelength, can lie, for example, in the previously mentioned second spectral range. The sensor radiation 48 in this case is thus formed by fluorescence radiation reflected at the membrane 32. The fluorescent layer can be formed, for example, from P43, i.e. gadolinium oxysulfide that is doped with terbium ($Gd_2O_2S$:Tb) or carrier materials, such as YAG, YAP or quartz, that are doped with cerium.

As is further illustrated in FIG. 1, an intensity sensor 50 in the form of a camera is arranged in a sensor beam path 49 of the sensor radiation 48. The intensity sensor 50 is arranged in the sensor beam path 49 so as to record an angularly resolved intensity distribution at least at one point in the object plane 22 of the optical imaging system, in particular at least at one point in the test structure region 26 of the test mask 24. The angularly resolved intensity distribution reproduces the intensity of the incoming radiation 18 in dependence of the angle of incidence with respect to the object plane 22.

The angularly resolved intensity distribution of the incoming radiation 18 in the object plane 22 corresponds to an intensity distribution of the radiation 18 in a pupil plane of the illumination system 20. There is thus a possibility with respect to the above-mentioned arrangement of the intensity sensor 50 for the purpose of recording the angularly resolved intensity distribution for arranging the intensity sensor 50 in a plane that is conjugated to the pupil plane of the illumination system 20. This makes direct recording of the angularly resolved intensity distribution possible. Another possibility with respect to the arrangement of the intensity sensor 50 for recording the angularly resolved intensity distribution is to arrange it in a plane in which the intensity values measured there can be calculated back to the incidence-angle-dependent intensity distribution by way of ray tracing.

FIG. 5 illustrates various embodiment variants of the intensity sensor 50 from (a) to (c). The embodiment variant according to FIG. 5A corresponds to the configuration of the intensity sensor 50 illustrated by way of example in FIG. 1. In this embodiment, the intensity sensor 50 comprises an optical element 52 in the form of a focusing lens and a two-dimensionally resolving detector 54. In the embodiment variant illustrated in FIG. 5B, a stop 56 is additionally arranged between the optical element 52 and the detector 54. The stop 56 is used to effect filtering of the angular distribution of the sensor radiation 49 which corresponds to a filtering of the angular distribution of the radiation 18 which occurs when the radiation 18 passes through the membrane 32 of the test mask 24. In other words, the stop 56 makes it possible to ascertain the angular distribution of the radiation 18 shortly after it passes through the test mask 24. If no such stop is used, for example as in the embodiment variant according to FIG. 5A, the influence of the filtering through the membrane 32 on the angular distribution can also be taken into consideration in computational fashion.

In the embodiment in which the apparatus 10 is designed for measuring the pupil-resolved transmission behavior of the optical imaging system 12, relative movements of the irradiation arrangement 14 with respect to the test mask 24 can be measured using a detection system and the influence thereof on the pupil-resolved transmission behavior be corrected accordingly.

The intensity sensor 50 in the embodiment variants according to FIG. 5A and FIG. 5B is designed for detecting sensor radiation 48 in the form of radiation having a wavelength of more than 100 nm, in particular visible light, as is generated, for example, when using the test mask 24 according to FIG. 2 and FIG. 3. In the case where the sensor radiation 48 has a wavelength of less than 100 nm, in particular a EUV wavelength, the intensity sensor 50 can be embodied in the embodiment variant according to FIG. 5C. In this variant, the sensor radiation 48 is directly incident on a two-dimensionally resolving detector 54.

The intensity sensor 50 is mounted in the apparatus 10 on a displacement device that is movable in six degrees of freedom such that it is possible to reach all field points in the test structure region 26 of the test mask 24. In this way, the angular distributions of the sensor radiation 49 that are associated with the respective field points can be recorded by corresponding positioning of the intensity sensor 50.

In addition to the intensity sensor 50, it is possible to also use another intensity sensor 51 in the apparatus 10. The intensity sensor 51 serves for measuring the spot distribution or spatially resolved intensity distribution of the incoming radiation 18 in the object plane 22. FIGS. 6A and 6B illustrate two embodiment variants of such an intensity sensor 51, which are configured, depending on the wavelength of the sensor radiation 48, in one case with a focusing optical element 52 in the form of a lens, and in the other case with a focusing mirror 58 for focusing the sensor radiation onto a two-dimensionally resolving detector 54.

The intensity sensor 50 can be used to determine in angularly resolved fashion, and thus resolved with respect to the pupil 15 of the optical system 12, the radiation energy of the packets of radiation that are radiated from the irradiation device 14 according to FIG. 1 onto the test mask 24. The above-mentioned analysis grating 38 is arranged in the image plane 40 of the optical imaging system 12 and mounted on a displacement device 41 with which the analysis grating 38 is displaceable in the x-y-plane according to the coordinate system of FIG. 1, and thus transversely to the optical axis 13.

By superposing waves generated by diffraction at the analysis grating 38, specifically by superposing a test wave on a reference wave, changed utilized radiation 39 is generated, which forms a superposition pattern in the form of an interferogram 44 on a detector surface 43 of the utilization detector 42.

The apparatus 10 furthermore comprises a control device 68 with which the displacement device 64 of the beam interruption device 60, the displacement device 41 of the analysis grating 38, and the utilization detector 42, as described below, can be operated in synchronized fashion with respect to one another. Upon a control signal from the control device 68, the beam interruption device 60 interrupts the electromagnetic radiation 18 in periodic sequence such that the electromagnetic radiation 18 travels through the optical system 12 in packets of radiation which are restricted in time.

The maximum time length of the packet of radiation is four seconds. In one embodiment, the time length is 100 to 1000 milliseconds. The analysis grating 38 is displaced between the individual packets of radiation using the displacement device 41 by a fraction of the period of the analysis grating 38, for example by a sixteenth of the grating period. In this case, sixteen so-called phase steps are carried out, between which the analysis grating 38 is in each case displaced by a fraction of the grating period. The phase steps are synchronized in each case with the successive packets of radiation in a form such that a phase step occurs each time the electromagnetic radiation 18 is interrupted, i.e. the closure element 62 is closed. The utilization detector 42 is controlled by the control device 68 such that the interferogram 44 generated during a single phase step is recorded or integrated by the utilization detector 42 over the entire exposure time of a packet of radiation.

In one embodiment of the shearing interferometer comprising the elements 24, 38, 41 and 42, the test structure region 26 of the test mask 24 has a two-dimensional measurement pattern and the analysis grating 38 is likewise two-dimensionally structured. In this case, the analysis grating 38 is phase-shifted both in the x-direction and in the y-direction in each case in n steps. An evaluation device 66 is used to calculate the derivations of the wavefront in the x-direction and y-direction from the interferograms 44 generated by the phase shifting in the x-direction and y-direction. By integrating the two derivations, the wavefront of the utilized radiation 47 after it has passed through the optical imaging system 12 is calculated.

The aberration behavior of the optical imaging system 12 can be ascertained from the wavefront that is thus determined. Before evaluating the interferograms 44 for calculating the wavefront, the interferograms 44 are first manipulated in the evaluation device 66 using the pupil-resolved radiation energies measured by the intensity sensor 50 for the individual packets of radiation. As already mentioned, the intensity sensor 50 measures for each of the individual phase steps the respective radiation energy of the associated packet of radiation in angularly resolved and pupil-resolved fashion. The respectively measured pupil-resolved radiation energy is then associated with the respective interferogram generated by the corresponding packet of radiation.

In a first embodiment of the manipulation of the interferograms 44, the respective intensity of the individual interferograms 44 captured by the detector 42 is adapted computationally to the pupil-resolved radiation energy that is associated with the respective interferogram 44. This occurs for example by dividing the individual interferograms before they are further processed by the respectively associated radiation energy distribution.

In another embodiment of the manipulation of the interferograms, an interferogram 44 recorded using the utilization detector 42 is discarded if one or more values of the associated pupil-resolved radiation energy distribution determined using the intensity sensor 50 exceed a fixed maximum distribution or fall short of a fixed minimum value distribution. The measurement of the discarded interferogram 44 is then repeated. In another embodiment, a decision is made in the evaluation of the recorded interferograms 44 on the basis of a mathematical criterion whether the respective interferogram 44 is used for determining the optical property of the optical imaging system 12 or is discarded instead. This can also relate to a full individual measurement. In particular, it is also possible for a derivation of the wavefront calculated from interferograms or for the wavefront calculated from the derivations to be dropped.

The above-described displacement of the analysis grating 38 by fractions of the grating period in n different phase steps is also referred to as so-called "slow phase shifting." In addition, in the embodiment of the shearing interferometer in which both the test structure region 26 of the test mask 24 and the analysis grating 38 have two-dimensional configurations, a so-called "fast phase shifting" is additionally carried out.

If the apparatus 10 is intended to be used for measuring the pupil-resolved transmission behavior of the optical imaging system 12, a mask having a two-dimensional arrangement of point-type test structures, for example in the form of pinholes of a hole mask, are used as the test mask 24. The utilization detector 42 is arranged far below the image plane 40 such that the angular distribution of the utilized radiation 47 present in the image plane 40 becomes visible on the detector surface 43. To this end, the utilization detector 42 can be arranged, for example, in a plane that is conjugated to the pupil plane of the optical imaging system 12. The analysis grating 38 can here be left in the image plane 40 or removed therefrom.

The evaluation device 66 then compares the angularly resolved intensity distribution recorded by the intensity sensor 50 to the intensity distribution recorded by the utilization detector 42 and determines, on the basis of any deviations, the pupil-resolved transmission behavior of the optical imaging system 12. It is thus possible to measure the contribution of the optical imaging system 12 to the apodization of the optical total system measured by the utilization detector 42 on the basis of the intensity distribution measured by the intensity sensor 50. The optical total system comprises in this context the irradiation arrangement 14 and the optical imaging system 12.

Figure 7:
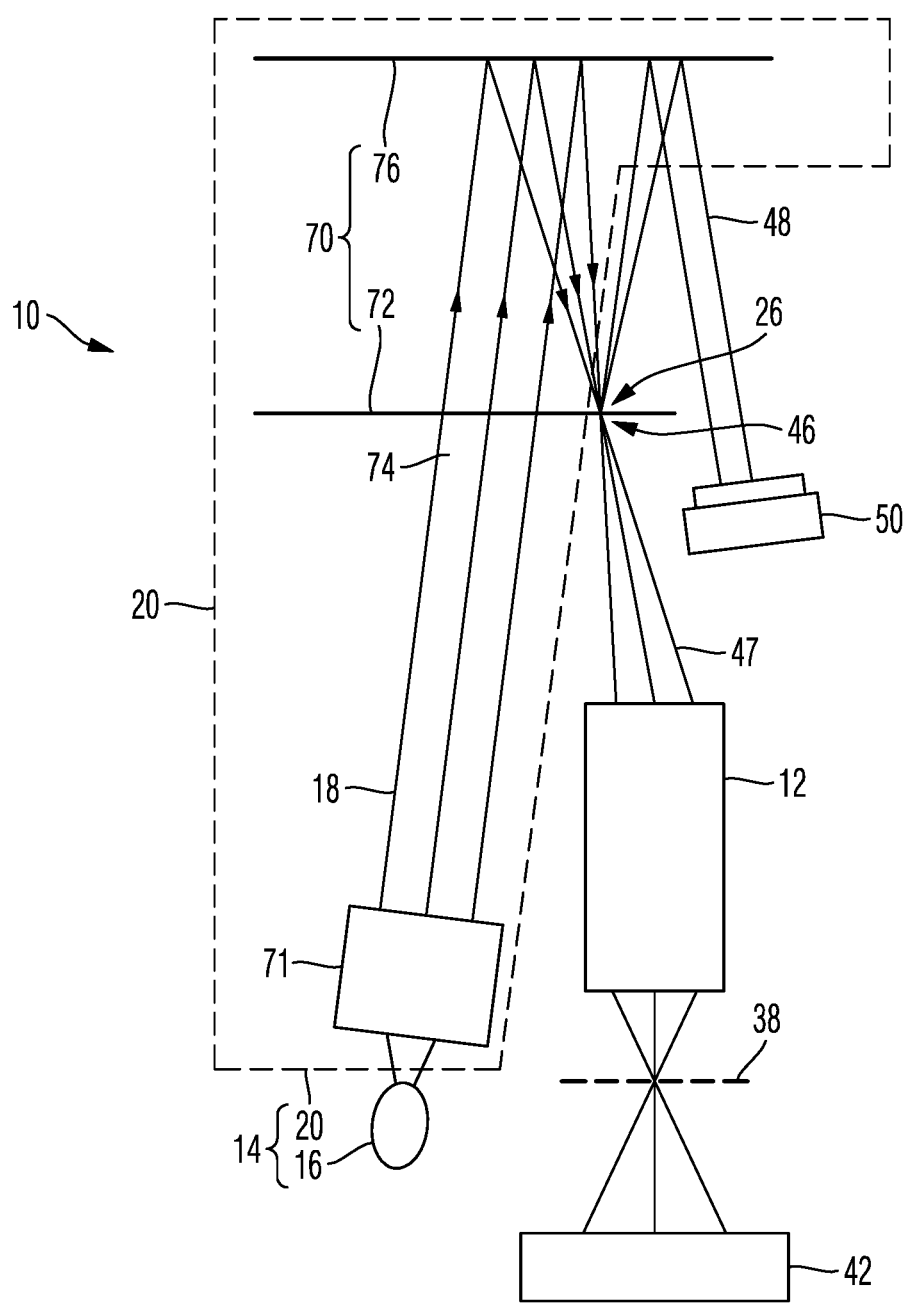
FIG. 7 shows a sectional view of a second embodiment of the apparatus according to the invention.

FIG. 7 illustrates a further embodiment of the apparatus 10, in which the intensity sensor is integrated in the illumination system 20. The illumination system 20 comprises in this embodiment an illumination module 70, which is known to a person skilled in the art in principle in terms of its configuration, for example from FIG. 8 of US 2006/0109544 A1. The electromagnetic radiation 18 generated by the radiation source 16 travels through the illumination module 70. Depending on the embodiment, it travels first through another illumination module 71 which is connected upstream of the illumination module 70. The illumination module 70 comprises a substrate 72 with a wavefront-forming scattering structure 74 and a focusing element 76 in the form of a multilayer arrangement, operated in reflection, with a diffractive focusing structure. The focusing element 76 focuses the radiation 18 coming from the scattering structure 74 onto a test structure region 26, which is likewise arranged on the substrate 72. The substrate 72 serves as a common carrier for the scattering structure 74 and the test structure region 26 and thus at the same time forms the test mask 24 according to FIG. 1.

The optical imaging system 12, the analysis grating 38 and the utilization detector 42 are arranged below the test structure region 26 of the substrate 72, analogously to the embodiment according to FIG. 1. An output coupling device 46 for coupling out the sensor radiation 48 is integrated in the test structure region 26 of the substrate 72 analogously to the variants that were previously described, in particular with reference to FIGS. 2 to 4. The sensor radiation 48 emitted by the test structure region 26 at the angle of reflection is reflected at the focusing element 76 of the illumination module 70 and directed to the intensity sensor 50 arranged below.

Figure 8:
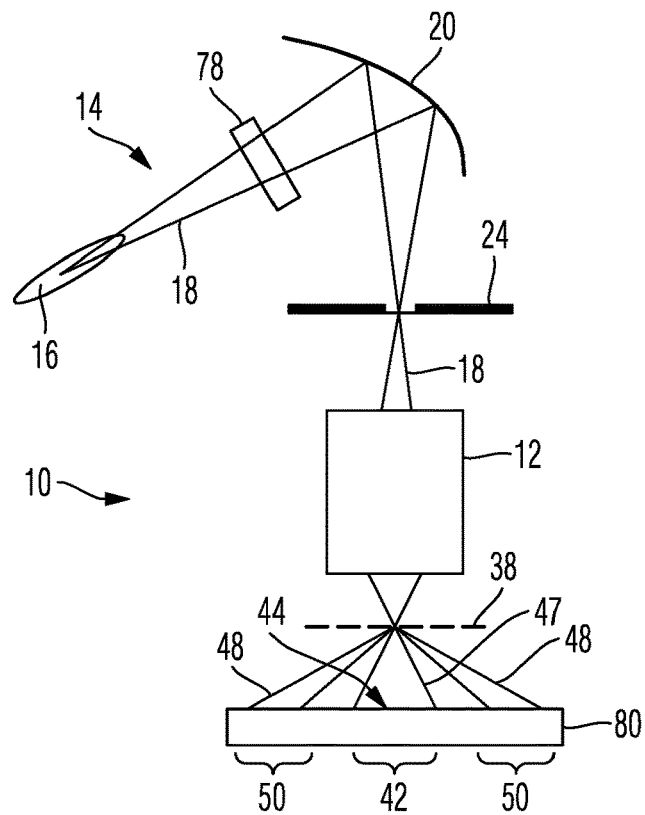
FIG. 8 shows a sectional view of a third embodiment of the apparatus according to the invention.

FIG. 8 illustrates a further embodiment of the apparatus 10 according to the invention. This differs from the embodiment according to FIG. 1 in as far as the intensity sensor 50 is not arranged above the test mask 24, but is integrated together with the utilization detector 42 in a unipartite detector 80 arranged below the analysis grating 38. The utilized radiation 47 is radiation of a first spectral range, in particular EUV radiation, and generates, as already described with reference to FIG. 1, interferograms 44 on the utilization detector 42 for corresponding evaluation. The irradiation arrangement 14 is furthermore configured such that the radiation 18 emitted thereby also radiates radiation of a second spectral range having a greater wavelength, for example light having a wavelength of more than 100 nm, in particular visible light, which is then used as sensor radiation 48. Owing to the greater wavelength of the sensor radiation 48, said sensor radiation 48 is diffracted at the analysis grating 38 more strongly than the utilized radiation 47.

The irradiation arrangement 14 furthermore comprises a frequency filter 78 arranged in the beam path of the radiation 18. Said frequency filter comprises, for example, a zirconium filter or a mesh grid and is configured to restrict the bandwidth of the sensor radiation 48 such that pupils with a defined edge can be detected on the detector 80 in the region that serves as the intensity sensor 50. The pupils of the sensor radiation 48 are spatially separated from one another and therefore do not form interferograms. The radiation cones of the sensor radiation 48, which start at the analysis grating 38 and are shown in the sectional view of FIG. 8 on the left and on the right with respect to the utilized radiation 47, can be formed, for example, by the +1st and −1st order of diffraction of the sensor radiation 48 at the analysis grating 38. The zeroth order of diffraction of the sensor radiation 48 is incident in that region of the detector 80 which serves as the utilization detector 42 and forms a constant underground in the measurement of the utilization detector signal. The time-resolved intensity distribution of the pupil of the sensor radiation 48 can be used to calibrate the intensities of the interferograms 44. It is thus possible to achieve better reproducibility.

Figure 9:
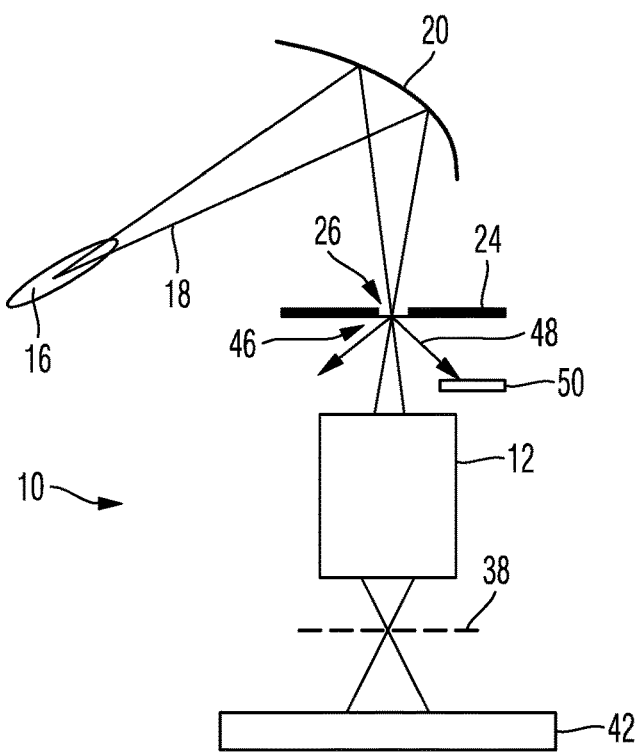
FIG. 9 shows a sectional view of a fourth embodiment of the apparatus according to the invention.

FIG. 9 illustrates a further embodiment of the apparatus 10 according to the invention. This differs from the embodiment according to FIG. 1 in as far as the intensity sensor 50 is not arranged above the test mask 24, but below, i.e. on the side of the imaging system 12. The intensity sensor 50 is here arranged such that light generated at the test structure region 26 from higher orders of diffraction can be captured thereby. This light generated from higher orders of diffraction thus serves as the sensor radiation 48. Such light of higher orders of diffraction is understood to mean light generated in the +/−4th order of diffraction and/or an order of diffraction that is higher in terms of absolute value. Said higher orders of diffraction have a greater aperture than the optical imaging system 12 and therefore do not reach the utilization detector 42, since they are generally blocked by the optical imaging system 12. The intensity sensor 50 can be arranged either, as shown in FIG. 9, in the region between the test mask 24 and the optical imaging system 12, or at a mount of an optical element of the imaging system 12. Such an arrangement of the intensity sensor 50 at a mount of an optical element of the imaging system 12 permits, with integration of the apparatus 10 in a microlithographic projection exposure apparatus, control of the exposure energy during the operation of the projection exposure apparatus.

Figure 10:
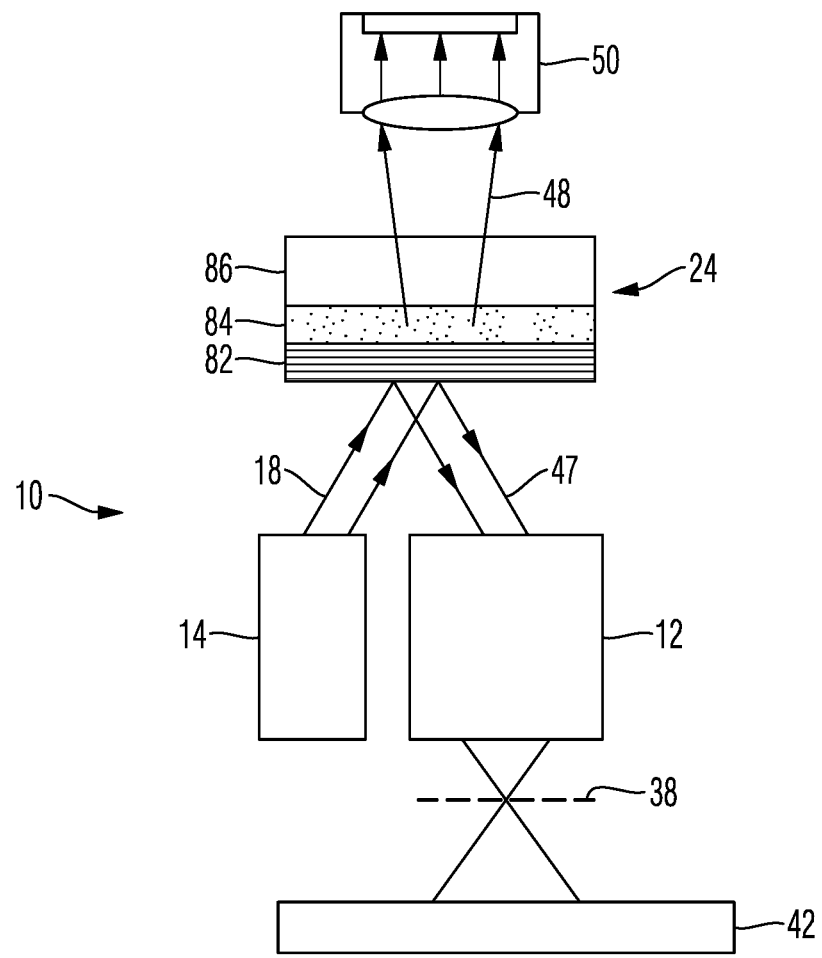
FIG. 10 shows a sectional view of a fifth embodiment of the apparatus according to the invention.

FIG. 10 illustrates a further embodiment of the apparatus 10 according to the invention. This differs from the embodiment according to FIG. 1 in as far as the test mask 24 is operated in reflection instead of in transmission, and the intensity sensor 50 is arranged on that side of the test mask 24 which is located opposite with respect to that side which is irradiated with radiation 18 from the irradiation arrangement 14. The test mask 24 in the embodiment according to FIG. 10 comprises a carrier element 86 and a multilayer arrangement 82 forming a surface of the test mask 24 that faces the irradiation arrangement 14 and the optical imaging system. The multilayer arrangement 82 can be designed as a MoSi layer system and is configured to reflect the incoming radiation 18 in the form of EUV radiation with a high efficiency. Arranged between the multilayer arrangement 82 and the carrier element 86 which is non-transmissive with respect to the incoming radiation 18 is a scintillator layer 84 configured to convert a portion of the radiation 18 passing through the multilayer arrangement 82 into radiation having a wavelength for which the carrier element 86 is transmissive. This wavelength-converted radiation then passes through the carrier element 86 as sensor radiation 48 and is recorded by the intensity sensor 50.

The apparatus 10 according to FIG. 1 or according to another above-described embodiment can be configured such that it can be used independently of a projection exposure apparatus in the laboratory for measuring an individual optical imaging system 12, such as a microlithographic projection optics. In an alternative embodiment, the apparatus 10 is integrated into a microlithographic projection exposure apparatus.

FIG. 11 shows an embodiment of a microlithographic projection exposure apparatus 100 operated in the EUV wavelength range, in which the apparatus 10 in an embodiment that is slightly modified with respect to the apparatus 10 illustrated in FIG. 1 is integrated. The projection exposure apparatus 100 can be designed as a stepper or a scanner. The apparatus 10 according to FIG. 11 differs from the apparatus 10 according to FIG. 1 in that the coherence mask 24 is designed not as a transmission mask but as a reflection mask and in that the beam interruption device 60 is arranged not upstream of an illumination mirror of the illumination system 20 but between an illumination mirror of an illumination system 120 and the test mask 24.

A radiation source 116 and the illumination system 120 are part of an illumination arrangement 114 of the projection exposure apparatus 100 exposing a product mask during the exposure operation of the projection exposure apparatus 100. The projection exposure apparatus 100 comprises a mask stage 125, which is also referred to as "reticle stage." During the performance of the measurement method according to the invention, the test mask 24 is held by the mask stage 125. FIG. 11 shows an exemplary projection optics 12 comprising a plurality of reflective optical elements 113.

The projection exposure apparatus 100 furthermore comprises a substrate stage 144, which can also be referred to as "wafer stage" and on which is arranged a wafer to be exposed during the exposure operation of the projection exposure apparatus 100. In the embodiment shown, the utilization detector 42 is integrated in a peripheral region of the substrate stage 144.

Figure 12:
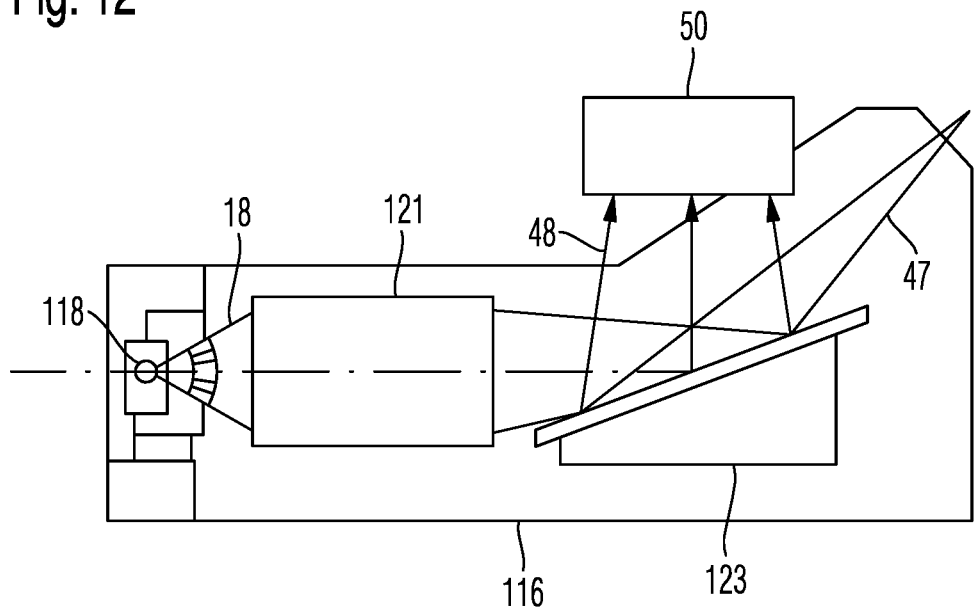
FIG. 12 shows a schematic sectional view of an embodiment of a radiation source of the projection exposure apparatus according to FIG. 11 having an intensity sensor integrated therein.

FIG. 12 illustrates a radiation source 116 of a projection exposure apparatus 100 of the type described in FIG. 11, which radiation source 116 is known to a person skilled in the art, for example, from FIG. 2 of U.S. Pat. No. 8,102,511 B2. The radiation source 116 comprises a beam generation unit 118, for example in the form of a plasma source, a radiation collector 121, and a spectral filter 123, operated in reflection, with integrated diffraction grating. After generation in the beam generation unit 118, the radiation 18 passes through the radiation collector 121 and is then reflected at the diffraction grating of the spectral filter 123. The radiation which is in the process reflected in the zeroth order of diffraction thereafter enters the illumination system, which is no longer illustrated in FIG. 12, as utilized radiation 47. According to an embodiment according to the invention, the intensity sensor 50 is arranged above the spectral filter 123, such that a higher order of diffraction of the radiation 18 reflected at the diffraction grating of the spectral filter 123, which differs from the zeroth order of diffraction, can be recorded thereby as sensor radiation 48.

Figure 13:
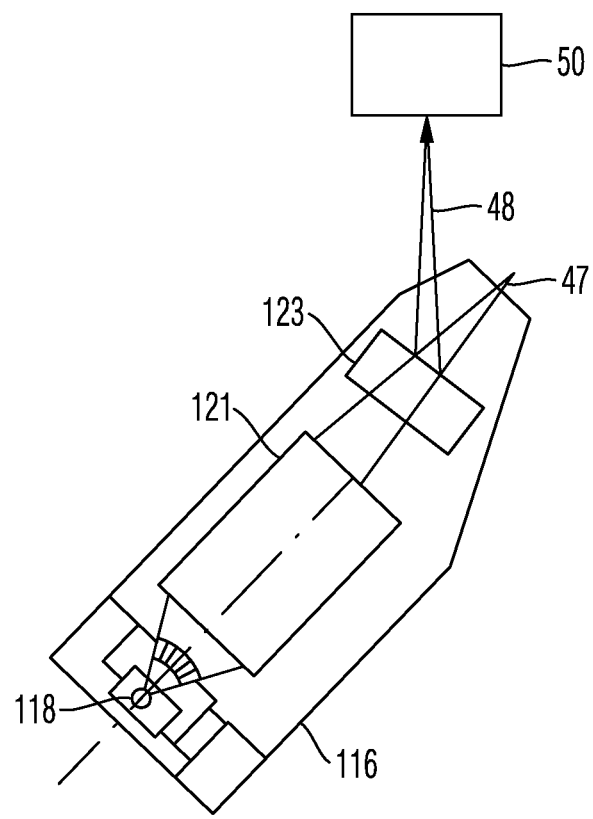
FIG. 13 shows a schematic sectional view of a further embodiment of a radiation source of the projection exposure apparatus according to FIG. 11 having an intensity sensor integrated therein.

FIG. 13 illustrates a radiation source 116 that is known to the person skilled in the art, for example, from FIG. 2 of US 2012/0182537 A1. According to FIG. 2 of U.S. Pat. No. 8,102,511 B2, this differs from the radiation source 116 illustrated in FIG. 12 substantially in that the spectral filter 123 is operated in transmission instead of in reflection. According to the embodiments according to the invention shown in FIG. 13, the intensity sensor 50 is arranged in a position that is suitable for capturing the sensor radiation 48, that is generated upon passage through the spectral filter 123 in a higher order of diffraction, by way of the intensity sensor 50.

LIST OF REFERENCE SIGNS 10 apparatus for determining an optical property
12 optical imaging system
13 optical axis
14 irradiation arrangement
16 radiation source
18 electromagnetic radiation
20 illumination system
22 object plane
24 test mask
26 test structure region
28 mask substrate
30 partially reflective layer arrangement
31 radiation-converting layer
32 membrane
34 aperture stop
36 pupil
38 analysis grating
39 changed utilized radiation
40 image plane
41 displacement device
42 utilization detector
43 detector surface
44 interferogram
45 utilized beam path
46 output coupling device
47 utilized radiation
48 sensor radiation
49 sensor beam path
50 intensity sensor
51 further intensity sensor
52 optical element
54 two-dimensionally resolving detector
56 stop
58 focusing mirror
60 beam interruption device
62 closure element
63 direction of displacement
64 displacement device
66 evaluation device
68 control device
70 illumination module
71 further illumination module
72 substrate
74 scattering structure
76 focusing element
78 frequency filter
80 integrated detector
82 multilayer arrangement
84 scintillator layer
86 carrier element
100 projection exposure apparatus
113 reflective optical element
114 irradiation arrangement
116 radiation source
118 radiation generation unit
120 illumination system
121 radiation collector
123 spectral filter
125 mask stage
144 substrate stage

What is claimed is:

1. An apparatus configured to determine an optical property of an optical imaging system, comprising:
   an illumination system configured to direct electromagnetic radiation generated by a radiation source onto an object plane of the imaging system,
   a utilization detector configured to determine the optical property, the detector being configured to capture the electromagnetic radiation after the electromagnetic radiation has traveled along a utilized beam path, wherein the utilized beam path extends from the radiation source via the imaging system to the utilization detector,
   an output coupling device arranged in the utilized beam path and configured to couple sensor radiation out of the utilized beam path and into a sensor beam path that differs from the utilized beam path, and
   an intensity sensor arranged in the sensor beam path and configured to record an angularly resolved intensity distribution at least at one point in the object plane of the optical imaging system, which intensity distribution reproduces electromagnetic radiation intensities with respect to angles of incidence in the object plane.

2. The apparatus as claimed in claim 1, wherein the output coupling device is arranged within a region of the utilized beam path that is located upstream of the imaging system.

3. The apparatus as claimed in claim 1, wherein the output coupling device is arranged in the illumination system.

4. The apparatus as claimed in claim 1, wherein the output coupling device comprises an at least partially reflective element.

5. The apparatus as claimed in claim 1, further comprising a test mask arranged in the object plane and comprising the output coupling device.

6. The apparatus as claimed in claim 1, wherein the illumination system is arranged to irradiate the object plane obliquely with the electromagnetic radiation.

7. The apparatus as claimed in claim 1, wherein the output coupling device comprises a radiation-converting element configured to generate the sensor radiation from part of the electromagnetic radiation traveling along the utilized beam path by changing a wavelength of the electromagnetic radiation.

8. The apparatus as claimed in claim 1, wherein the output coupling device is configured to couple radiation having a wavelength that differs from an operating wavelength of the optical imaging system out of the electromagnetic radiation of the utilized beam path as sensor radiation.

9. The apparatus as claimed in claim 1, wherein the output coupling device is configured to couple the sensor radiation out of the utilized beam path by way of +/−4th order of diffraction or an order of diffraction which is higher in absolute value.

10. The apparatus as claimed in claim 1, wherein the output coupling device comprises a diffraction grating.

11. The apparatus as claimed in claim 1, wherein the output coupling device comprises an analysis grating configured to generate an interferogram on the utilization detector from a radiation component of the electromagnetic radiation having a first wavelength and to direct a radiation component of the electromagnetic radiation having a second wavelength in an order of diffraction other than the zeroth order of diffraction onto the intensity sensor.

12. The apparatus as claimed in claim 1, in which the utilization detector and the intensity sensor are integrated in a unipartite detector.

13. The apparatus as claimed in claim 1, and configured to periodically interrupt the radiation emitted by the illumination system such that the radiation is incident on the object plane in packets of radiation of predetermined duration.

14. The apparatus as claimed in claim 1, configured for an operating wavelength in the extreme ultraviolet wavelength range.

15. The apparatus as claimed in claim 1, further comprising an evaluation device configured to correct the optical property of the optical imaging system, which is determined by the utilization detector, in accordance with the angularly resolved intensity distribution that is recorded by the intensity sensor.

16. The apparatus as claimed in claim 1, wherein the optical property comprises a wavefront aberration behavior of the optical imaging system.

17. The apparatus as claimed in claim 1, further comprising an evaluation device configured to determine a pupil-resolved transmission behavior of the optical imaging system by evaluating measurement results of the utilization detector and the angularly resolved intensity distribution recorded by the intensity sensor.

18. The apparatus as claimed in claim 1, wherein the intensity sensor is configured also to record a spatially resolved intensity distribution in the object plane of the optical imaging system.

19. A microlithographic projection exposure apparatus, comprising an apparatus as claimed in claim 1.

20. A method for determining an optical property of an optical imaging system, comprising:
    directing electromagnetic radiation onto an object plane of the imaging system,
    determining the optical property with a utilization detector from the electromagnetic radiation after the electromagnetic radiation has traveled along a utilized beam path, wherein the utilized beam path extends from a source for the electromagnetic radiation via the imaging system to the utilization detector,
    coupling sensor radiation out of the utilized beam path and into a sensor beam path that differs from the utilized beam path, and
    recording, with an intensity sensor arranged in the sensor beam path, an angularly resolved intensity distribution at least at one point in the object plane of the optical imaging system, which intensity distribution reproduces electromagnetic radiation intensities with respect to angles of incidence in the object plane.

21. The method as claimed in claim 20, further comprising correcting a measurement performed by the utilization detector when the optical property is determined, in accordance with the angularly resolved intensity distribution recorded by the intensity sensor.

22. The method as claimed in claim 20, further comprising determining a pupil-resolved transmission behavior of the optical imaging system as the optical property by evaluating a measurement result of the utilization detector and the angularly resolved intensity distribution recorded by the intensity sensor.

* * * * *

UNITED STATES PATENT AND TRADEMARK OFFICE
CERTIFICATE OF CORRECTION

PATENT NO. : 10,006,807 B2
APPLICATION NO. : 15/075369
DATED : June 26, 2018
INVENTOR(S) : Ehrmann et al.

Page 1 of 1

It is certified that error appears in the above-identified patent and that said Letters Patent is hereby corrected as shown below:

In the Specification

Column 4, Line 37, Delete "and or" and insert -- and/or --, therefor.

Signed and Sealed this
Seventeenth Day of September, 2019

Andrei Iancu
*Director of the United States Patent and Trademark Office*